US008504793B2

(12) United States Patent
Fisher et al.

(10) Patent No.: US 8,504,793 B2
(45) Date of Patent: Aug. 6, 2013

(54) ADAPTIVE MEMORY SYSTEM FOR ENHANCING THE PERFORMANCE OF AN EXTERNAL COMPUTING DEVICE

(75) Inventors: Louis Cameron Fisher, Bainbridge Island, WA (US); Stephen V. R. Hellriegel, Bainbridge Island, WA (US); Mohammad S. Ahmadnia, Seattle, WA (US)

(73) Assignee: Mobile Semiconductor Corporation, Seattle, WA (US)

( * ) Notice: Subject to any disclaimer, the term of this patent is extended or adjusted under 35 U.S.C. 154(b) by 0 days.

(21) Appl. No.: 13/363,151

(22) Filed: Jan. 31, 2012

(65) Prior Publication Data
US 2012/0131269 A1    May 24, 2012

Related U.S. Application Data

(62) Division of application No. 11/972,537, filed on Jan. 10, 2008, now Pat. No. 8,135,933.

(60) Provisional application No. 60/884,378, filed on Jan. 10, 2007.

(51) Int. Cl.
*G06F 12/00* (2006.01)
*G06F 13/00* (2006.01)

(52) U.S. Cl.
USPC ............ 711/170; 711/100; 711/137; 711/154

(58) Field of Classification Search
USPC ............. 711/5, 100, 113, 114, 118, 137, 154, 711/170
See application file for complete search history.

(56) References Cited

U.S. PATENT DOCUMENTS

| 5,509,132 | A  |   | 4/1996  | Matsuda |
|-----------|----|---|---------|---------|
| 5,602,999 | A  | * | 2/1997  | Hyatt ............................... 711/1 |
| 5,699,317 | A  | * | 12/1997 | Sartore et al. ............ 365/230.06 |
| 6,029,224 | A  |   | 2/2000  | Asthana |
| 6,212,597 | B1 |   | 4/2001  | Conlin |
| 6,230,235 | B1 | * | 5/2001  | Lu et al. ........................ 711/106 |

(Continued)

FOREIGN PATENT DOCUMENTS

EP    1 804 156 A2    7/2007

OTHER PUBLICATIONS

Hidaka, H, et al., "The Cache DRAM Architecture: A DRAM With an On-Chip Cache Memory," IEEE Micro 10(2):14-25, Apr. 1990.

(Continued)

*Primary Examiner* — Tuan Thai
(74) *Attorney, Agent, or Firm* — Christensen O'Connor Johnson Kindness PLLC

(57) ABSTRACT

An adaptive memory system is provided for improving the performance of an external computing device. The adaptive memory system includes a single controller, a first memory type (e.g., Static Random Access Memory or SRAM), a second memory type (e.g., Dynamic Random Access Memory or DRAM), a third memory type (e.g., Flash), an internal bus system, and an external bus interface. The single controller is configured to: (i) communicate with all three memory types using the internal bus system; (ii) communicate with the external computing device using the external bus interface; and (iii) allocate cache-data storage assignment to a storage space within the first memory type, and after the storage space within the first memory type is determined to be full, allocate cache-data storage assignment to a storage space within the second memory type.

10 Claims, 9 Drawing Sheets

U.S. PATENT DOCUMENTS

| | | |
|---|---|---|
| 6,279,063 B1 * | 8/2001 | Kawasaki et al. ............. 710/110 |
| 6,392,950 B2 | 5/2002 | Ayukawa |
| 6,694,380 B1 | 2/2004 | Wolrich |
| 6,836,839 B2 | 12/2004 | Master |
| 6,928,512 B2 | 8/2005 | Ayukawa |
| 6,986,021 B2 | 1/2006 | Master |
| 7,173,863 B2 | 2/2007 | Conley |
| 7,215,580 B2 | 5/2007 | Gorobets |
| 7,305,500 B2 | 12/2007 | Adiletta |
| 7,657,706 B2 | 2/2010 | Iyer |
| 2002/0138716 A1 | 9/2002 | Master |
| 2002/0199056 A1 | 12/2002 | Ayukawa |
| 2003/0105949 A1 | 6/2003 | Master |
| 2004/0093589 A1 | 5/2004 | Master |
| 2004/0093601 A1 | 5/2004 | Master |
| 2004/0199727 A1 | 10/2004 | Narad |
| 2005/0220115 A1 | 10/2005 | Romano |
| 2005/0286336 A1 * | 12/2005 | Harari et al. ................ 365/232 |
| 2006/0031660 A1 | 2/2006 | Master |
| 2006/0041711 A1 | 2/2006 | Miura |
| 2006/0095622 A1 | 5/2006 | Rosner |
| 2007/0143547 A1 | 6/2007 | Farmer |
| 2009/0063757 A1 | 3/2009 | Norman |
| 2009/0172291 A1 | 7/2009 | Sprangle |
| 2009/0172315 A1 | 7/2009 | Iyer |

OTHER PUBLICATIONS

Marsh, B., et al., "Flash Memory File Caching for Mobile Computers," Proceedings of the IEEE 27th Annual Hawaii International Conference on System Sciences (HICSS-27), Maui, Hawaii, Jan. 4-7, 1994, vol. 1, pp. 451-460.

Extended European Search Report and Written Opinion mailed May 10, 2011, in corresponding European Application No. EP 08 713 711.3, filed Jan. 10, 2008, 11 pages.

SIPO Notification of the Second Office Action, mailed Dec. 19, 2011, issued in corresponding Chinese Application No. 200880002127.X, filed Jan. 10, 2008, 11 pages.

Written Opinion and Search Report of the International Searching Authority mailed Jun. 17, 2008, in corresponding International Application No. PCT/US2008/050787, filed Jan. 10, 2008, 7 pages.

* cited by examiner

—PRIOR ART—

ADAPTIVE MEMORY SYSTEM FOR ENHANCING THE PERFORMANCE OF AN EXTERNAL COMPUTING DEVICE

CROSS-REFERENCES TO RELATED APPLICATIONS

This application is a divisional of application Ser. No. 11/972,537, filed Jan. 10, 2008, which claims the benefit of Provisional Application No. 60/884,378, filed Jan. 10, 2007, the entire disclosures of which are hereby incorporated by reference herein for all purposes.

BACKGROUND

Modern computing devices typically have multiple and differing types of internal memory components, which are required to support different end applications. These memory components and their associated characteristics are some of the crucial metrics by which a computing device's performance can be measured. Modern computing devices are usually further capable of functioning with add-on memory components through various built in communications channels, such as a PCI bus, a Firewire port, a USB port, or a specialized Multi-Media Card (MMC) port. All of these internal and add-on memory components consist of either volatile or non-volatile memory, or some combination thereof. Nand Flash and Nor Flash are common types of non-volatile memory. Dynamic Random Access Memory (DRAM) and Static Random Access Memory (SRAM) are types of volatile memory. Memory type may be classified based on performance and density. High performance memories such as SRAM are larger, more costly to implement, and dissipate more power. Higher density memories, such as DRAM, are more cost effective, but typically have worse performance measured by access time for single elements and by the bandwidth, or rate of transfer of the memory contents to the processing elements which require the data or instructions contained in the memory system.

These associated tradeoffs are especially critical when these modern memory systems are implemented in mobile devices, such as Laptop PCs, cellular phones, PDAs, or any other variety of ultra-portable personal computing devices. In such devices, the additional considerations of power consumption and form factor make it critical that the memory resources be optimally configured and utilized. Fortunately, increasing levels of computer product integration have made it possible to package multiple memory types into a single complete memory system package, with features that significantly improve memory data-transfer and associated processing speeds.

One particular application where such integrated packaging is useful is in cache memory systems. Most modern computing systems have integrated caching systems comprising both a Level 1 and a Level 2 SRAM cache. Typically, a processor uses the cache to reduce the average time to access similar data from memory. The SRAM cache is a low-capacity, fast memory type, which stores copies of frequently accessed data from main memory locations.

When a processor attempts to read or write from or to a main memory location, it first checks the cache memory location to see if a previously stored copy of similar data is available. The processor does this by comparing the data address memory location with the cache to see if there is a cache hit (data exists in cache). If the processor does not find the data in cache, a cache miss occurs and the processor must run at a much slower data retrieval rate as it is required to access data from a slower main-memory location, such as a hard-disc or Flash memory. It would be advantageous to increase the cache hit in some way as to reduce the need for accessing the slowest memory type to find frequently accessed data.

Further still, most modern add-on cache memory systems include Flash memory and RAM memory wherein the Flash control occurs off-circuit at the external computing device's processor. This type of system is inefficient, because transfer between the Flash and RAM memory must be facilitated by routing data from the add-on memory system's Flash, across an external processor bus to the external computing device processor, and back across the external processor bus to the add-on memory system's RAM.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

In view of the inefficiencies associated with the prior art memory systems as discussed in the background section above, the inventors of the present application have devised an adaptive memory device which facilitates cache expansion using less expensive DRAM technology, while at the same time allowing direct memory transfer between memory components of the same add-on memory system. Further, the present invention may advantageously incorporate specialized caching algorithms to take advantage of this expanded cache and internal memory access.

In accordance with one embodiment of the present invention, an adaptive memory system is provided for improving the performance of an external computing device. The adaptive memory system includes a single controller, a first memory type (e.g., Static Random Access Memory or SRAM), a second memory type (e.g., Dynamic Random Access Memory or DRAM), a third memory type (e.g., Flash), an internal bus system, and an external bus interface. The single controller is configured to: (i) communicate with all three memory types using the internal bus system; (ii) communicate with the external computing device using the external bus interface; and (iii) allocate cache-data storage assignment to a storage space within the first memory type, and after the storage space within the first memory type is determined to be full, allocate cache-data storage assignment to a storage space within the second memory type.

In accordance with one aspect of the present invention, the first and second memory types are distinct volatile memory types (e.g., SRAM and DRAM) and the third memory type is a non-volatile type (e.g., Flash), and the single controller is further configured to power down portions of the first and second memory types that have not been written to, to minimize power consumption.

In accordance with another aspect of the present invention, the single controller may be further configured to transfer cache-data to the DRAM from either the SRAM or the Flash Memory. If the cache-data exists within the SRAM, the cache-data is transferred from the SRAM to the DRAM. If the cache-data does not exist within the SRAM, and does exist within the Flash Memory, the cache-data is transferred from the Flash Memory to the DRAM.

In accordance with yet another aspect of the present invention, the single controller may be further configured to cache data from the Flash memory to the SRAM and DRAM according to a data look-ahead scheme.

In accordance with another embodiment of the present invention, a method is provided for controlling an adaptive memory system, wherein the adaptive memory system includes a single controller, a first memory type, a second memory type, a third memory type, an internal bus system, and an external bus interface. The method includes generally three steps: (i) communicating with all three memory types using the internal bus system; (ii) communicating with an external computing device using the external bus interface; and (iii) allocating cache-data storage assignment to a storage space within the first memory type, and after the storage space within the first memory type is determined to be full, allocating cache-data storage assignment within a storage space of the second memory type.

In accordance with yet another embodiment of the present invention, a computer-readable medium including a computer-executable program is provided for controlling the operation of a single controller of an adaptive memory system. The adaptive memory system further including a first memory type, a second memory type, a third memory type, an internal bus system, and an external bus interface. The computer-executable program, when executed, causes the single controller to perform a method including generally three steps: (i) communicating with all three memory types using the internal bus system; (ii) communicating with an external computing device using the external bus interface; and (iii) allocating cache-data storage assignment to a storage space within the first memory type, and after the storage space within the first memory type is determined to be full, allocating cache-data storage assignment to a storage space within the second memory type.

In accordance with a further embodiment of the present invention, a computer-readable medium including a computer-executable program is provided for implementing a data look-ahead caching scheme of a single controller of an adaptive memory system. The adaptive memory system further including a first memory type, a second memory type, a third memory type, an internal bus system, and an external bus interface. The computer-executable program, when executed, causes the single controller to perform a method including generally four steps: (i) acquiring a sequence of sector data from an application run on an external computing device; (ii) comparing the acquired sequence of sector data to a plurality of previously stored sequences of sector data to determine if there is a high-probability match; (iii) if a high-probability match is determined between the acquired sequence of sector data and the plurality of previously stored sequences of sector data, caching at least the first memory type with the determined high-probability match; and (iv) if a high-probability match is not determined between the acquired sequence of sector data and the plurality of previously stored sequences of sector data, determining whether a most-likely sequence of sector data can be selected from the plurality of previously stored sequences of sector data.

In accordance with one aspect of the present invention, if a most-likely sequence of sector data can be selected, a selected most-likely sequence of sector data is cached into either the first memory type or the second memory type; and if a most-likely sequence of sector data cannot be selected, a cache-data training sequence is initiated.

In accordance with another aspect of the present invention, the cache-data training sequence stores the acquired sequence of sector data within either the first memory type or the second memory type with a non-volatile copy of the sequence stored in the third memory type.

In accordance with a still further embodiment of the present invention, a method is provided for implementing a data look-ahead caching scheme of a single controller of an adaptive memory system. The adaptive memory system includes a single controller, a first memory type, a second memory type, a third memory type, an internal bus system, and an external bus interface. The method includes generally four steps: (i) acquiring a sequence of sector data from an application run on an external computing device; (ii) comparing the acquired sequence of sector data to a plurality of previously stored sequences of sector data to determine if there is a high-probability match; (iii) if a high-probability match is determined between the acquired sequence of sector data and the plurality of previously stored sequences of sector data, caching the determined high-probability match data to at least the first memory type; and (iv) if a high-probability match is not determined between the acquired sequence of sector data and the plurality of previously stored sequences of sector data, determining whether a most-likely sequence of sector data can be selected from the plurality of previously stored sequences of sector data.

DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION

The present invention is directed to an Adaptive Memory System (AMS), comprising both volatile and non-volatile memory components and a controller component that is configured to manage data transfer between the memory components and between the memory components and an external computing device. The memory components and the controller component, collectively called herein as the AMS components, are embodied on a Multi-Chip Package integrated circuit (MCP), which can be configurably designed to be removably inserted into any traditional personal computing device, such as a desktop PC, a laptop PC, cellular phone, a PDA, or an ultra-mobile PC. The present invention is further directed to a data transfer control scheme implemented by the AMS Controller component, which enhances the overall performance associated with data-transfer between the AMS and an external computing device.

Figure 1:
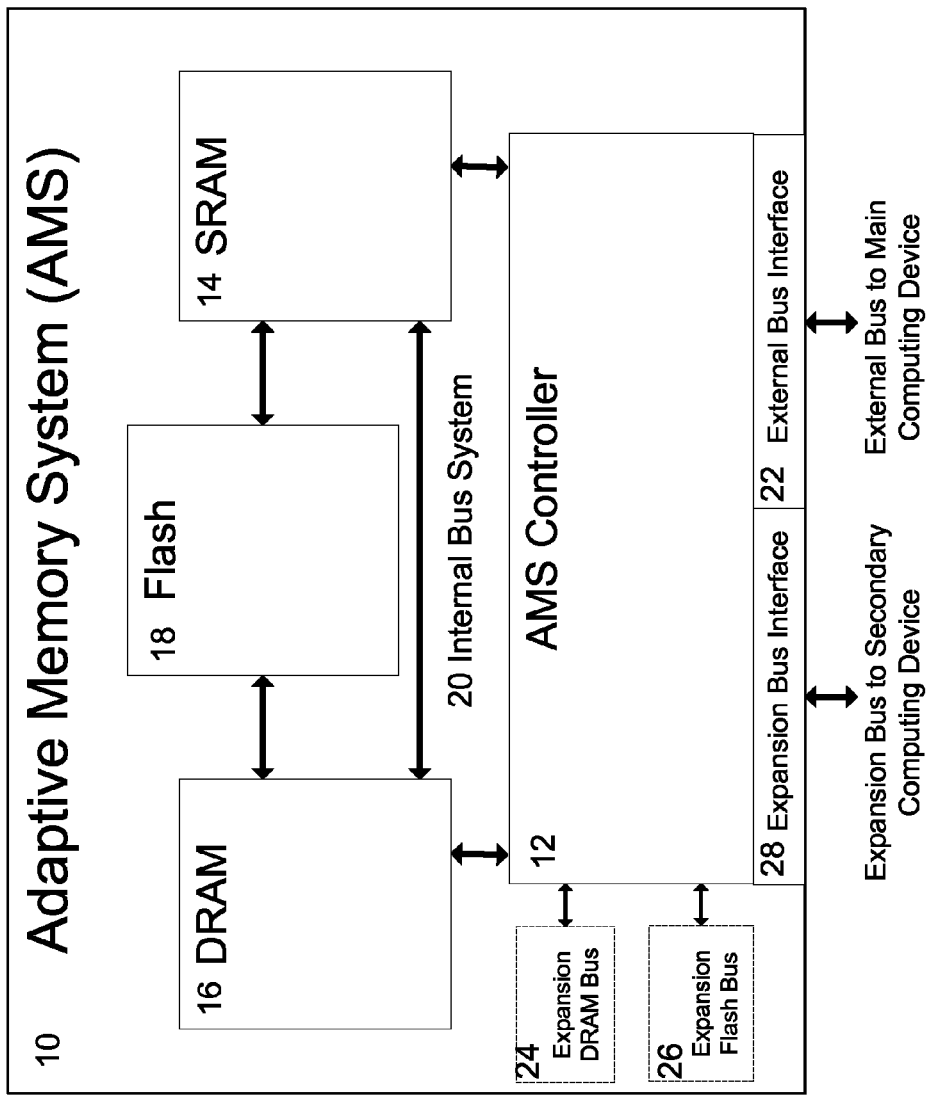
FIG. 1 is a block diagram of the Adaptive Memory System (AMS) in accordance with one embodiment of the present invention.

In accordance with one embodiment, illustrated in FIG. 1, an AMS 10 includes multiple AMS memory component types including: Static Random Access Memory (SRAM) 14, Dynamic Random Access Memory (DRAM) 16, and Flash Memory 18. It should be understood that the memory component types of the present embodiment are mere examples of memory types capable of functioning within the AMS, and that the invention is not limited to the precise memory types used in the present embodiment. The AMS Controller component (or "Controller" in short) 12 is configured to communicate with the SRAM, DRAM, and Flash Memory components through an Internal Bus System 20 and with an external computing device (not shown) through an External Bus Interface 22. This configuration allows the AMS Controller 12 to completely manage the data flow between the memory components, independent of an external computing device.

Figure 2:
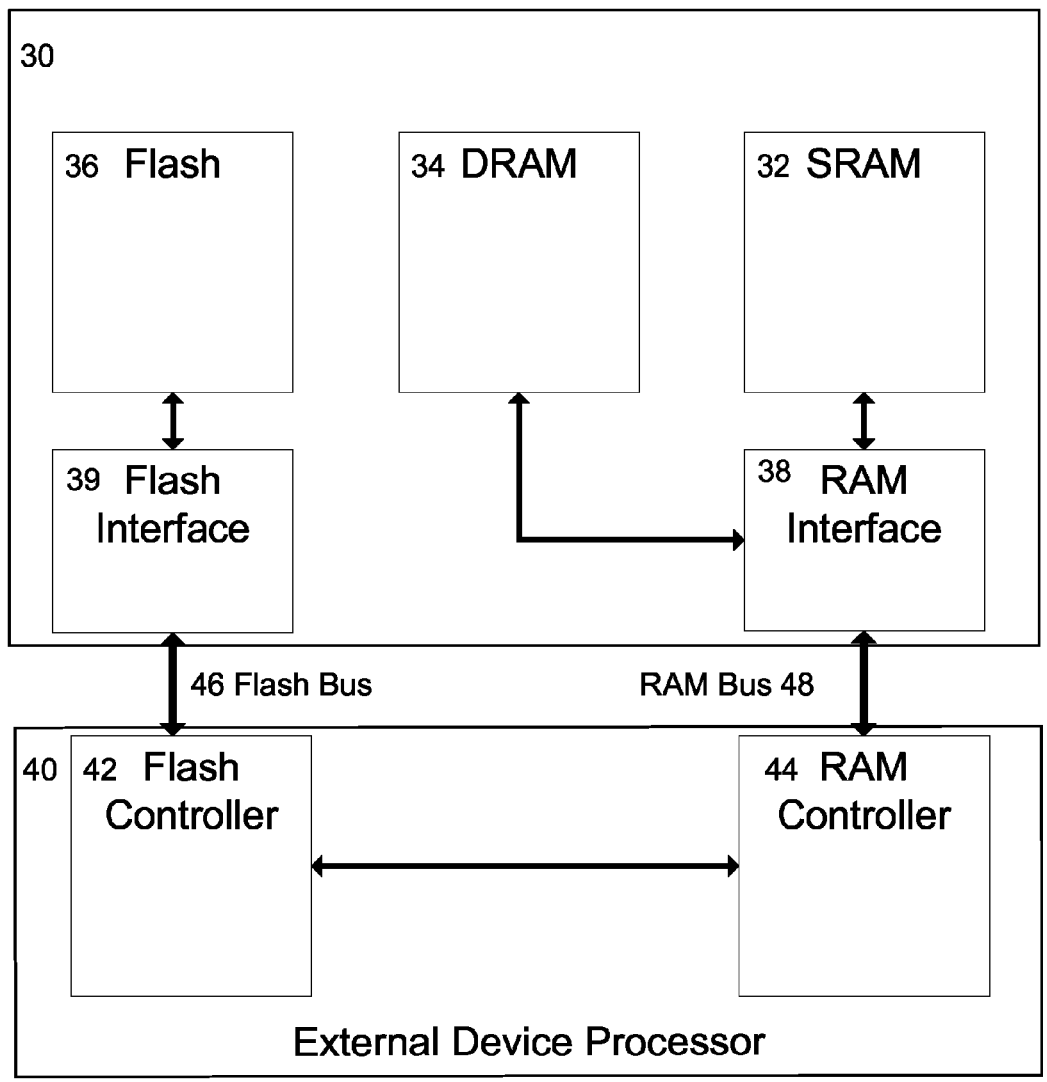
FIG. 2 is a block diagram illustrating a traditional memory system interface with an external computing device in accordance with the prior art.

In traditional MCP memory devices comprising similar memory component types, as illustrated in FIG. 2, the control for Flash memory data transfer occurs at an external computing device. For example, when an application is run on an external computing device and application data is required to be transferred between a Flash memory component 36 and a RAM memory component 32, 34 of an MCP memory device 30 (e.g., when caching application page data), the processor of the external computing device 40 controls the transfer of the Flash data using an integrated Flash Controller 42. In this system, transferable Flash data must be routed from the MCP memory device's Flash memory component 36 by the external computing device's processor 40 across a Flash interface 39 and an external Flash bus 46, and back across a RAM double-data rate (DDR) bus 48 and a RAM interface 38 to the MCP memory device's RAM memory components 32, 34. This data routing scheme is inefficient for transferring (caching) data between non-volatile (e.g., Flash) and volatile (e.g., RAM) memory components on the same MCP memory device.

The AMS MCP technology according to various embodiments of the present invention, for example as illustrated in FIG. 1, cures this inefficiency by facilitating Direct Memory Access (DMA) between AMS Flash (18) and RAM (14, 16) memory components, not requiring use of an external computing device's processor. The on-circuit AMS Controller 12 of the present invention controls data transfer between a Flash memory component 18 and a RAM memory component 14, 16, such that Flash data can be directly transferred through the Internal Bus System 20 to a desired RAM memory component location 14, 16. Because this DMA data-transfer control scheme does not require the use of an external computing device's processor, it effectively reduces the use of external bus bandwidth, wherein the external bus is the bus between the AMS and an external computing device. In this way, the external bus bandwidth can be optimized to allow the external computing device's processor to read and write data from and to the AMS memory components at a much higher rate, according to various embodiments of the present invention. Further, the shorter physical DMA interconnect between the AMS Flash memory component 18 and the AMS RAM memory components 14, 16 offers a lower parasitic capacitance compared with the traditional transfer scheme discussed above. Excess parasitic capacitance in circuits is known to reduce bandwidth, enhance the likelihood of outside interference, and increase power consumption during normal circuit operation conditions. The shorter wire-length data transfer achieved in the present invention offers a significant power savings when data is repeatedly transferred between these AMS memory components (e.g., when caching page data).

Figure 3:
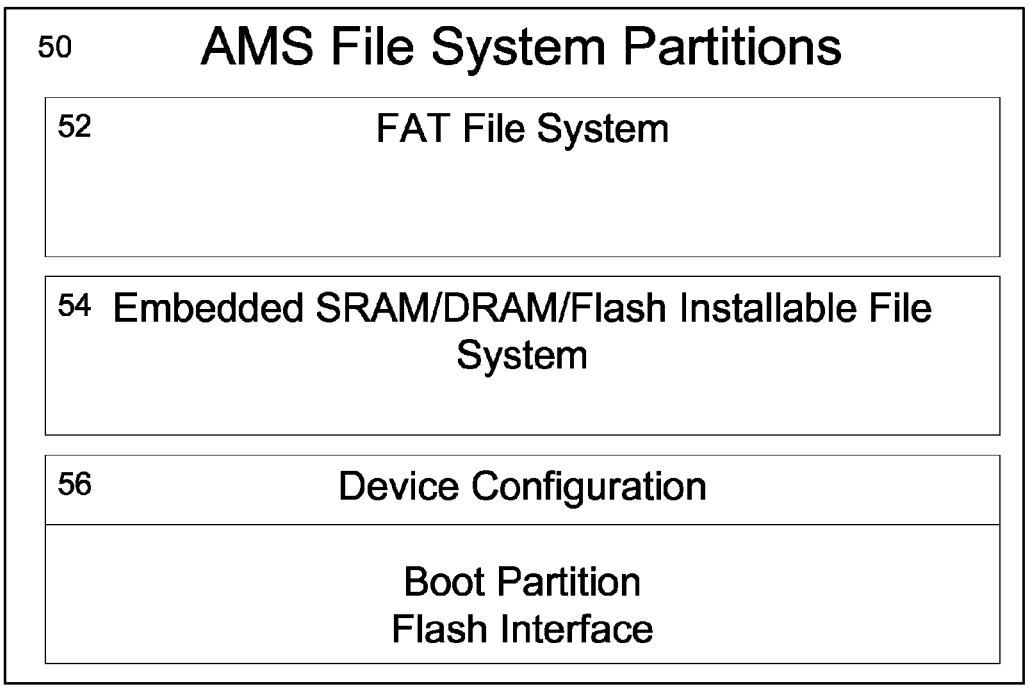
FIG. 3 is a block diagram illustrating the AMS file system partitions in accordance with one embodiment of the present invention.

Another advantage of decoupling the AMS memory component data transfer control from the external computing device's processor is that actual file management functionality is embedded within the AMS prior to shipment. This allows the AMS to be seen by an external computing device as a standard file system. A standard file system can be supported by standard operating system level drivers, thereby eliminating the need for maintaining specialized flash-dependant device drivers at the operating system level. The self-contained flash driver software of the AMS is contained within the Embedded SRAM/DRAM/Flash Installable File System Partition 54 of the AMS File System Partitions 50 illustrated in FIG. 3. Other AMS file system partitions include a standard FAT File System Partition 52 and a Device Configuration Partition 56 including Boot Partition and Flash Interface data, in the illustrated embodiment. The embedded flash driver software does not require additional testing at the point of integration with an operating system. This independent memory driver control advantageously allows for the AMS to be recognized by almost any operating system, without requiring additional installation of specialized memory driver software on the external computing device.

The AMS Controller 12 may be further configured to minimize power consumption by selectively gating power flow to portions of the AMS SRAM and DRAM volatile memory components 14, 16. Such a power savings technique is preferable because, as is well known in the art, both SRAM and DRAM volatile memory types require a constant power-draw to maintain or refresh existing data held within portions of their respective memory areas. To minimize this power-draw in the AMS, in various exemplary embodiments of the present invention, the Controller 12 monitors the RAM memory components to detect when portions of the SRAM or DRAM 14, 16, are not scheduled to be written to and are not already holding data. Upon detection of an inactive portion of RAM, the Controller 12 powers down those portions of the inactive SRAM or DRAM 14, 16, to minimize power loss. In this way, power consumption can be dynamically regulated from within the AMS device, without requiring any input from the processor of an external computing device.

According to various exemplary embodiments of the present invention, the AMS, such as seen in FIG. 1, is configured to be used as a high speed adaptive cache with portions of the SRAM 14 functioning as Level 1 and Level 2 cache partitions, and portions of the DRAM 16 functioning as a Level 3 cache partition. The high speed cache can operate in conjunction with the existing cache system of an external computing device, to adaptively enhance data storage and retrieval for the combined system. The AMS integrated cache is preferably utilized for data transfer and data storage related to operations associated with: Boot Code Mirror, Program Data, Program Code, and Application Data. The size and Level of cache used for such functions is dynamically allocated based on configuration settings and required performance metrics.

Boot Code Mirror and Program Code

The boot code is copied from the Flash 18 to the SRAM cache 14 to rapidly initialize the device processor. This represents the initial use of SRAM cache 14.

Additional program code is identified as data requested from the Flash 18. This additional program code may be copied to either SRAM or DRAM cache 14, 16, depending on allocated cache size and availability. Preferably, the SRAM cache 14 is filled prior to DRAM cache 16, as the use of the DRAM cache consumes more power than the SRAM cache due to the constantly required refreshing of DRAM data.

Detained Data Flow and Partitioning

Figure 4:
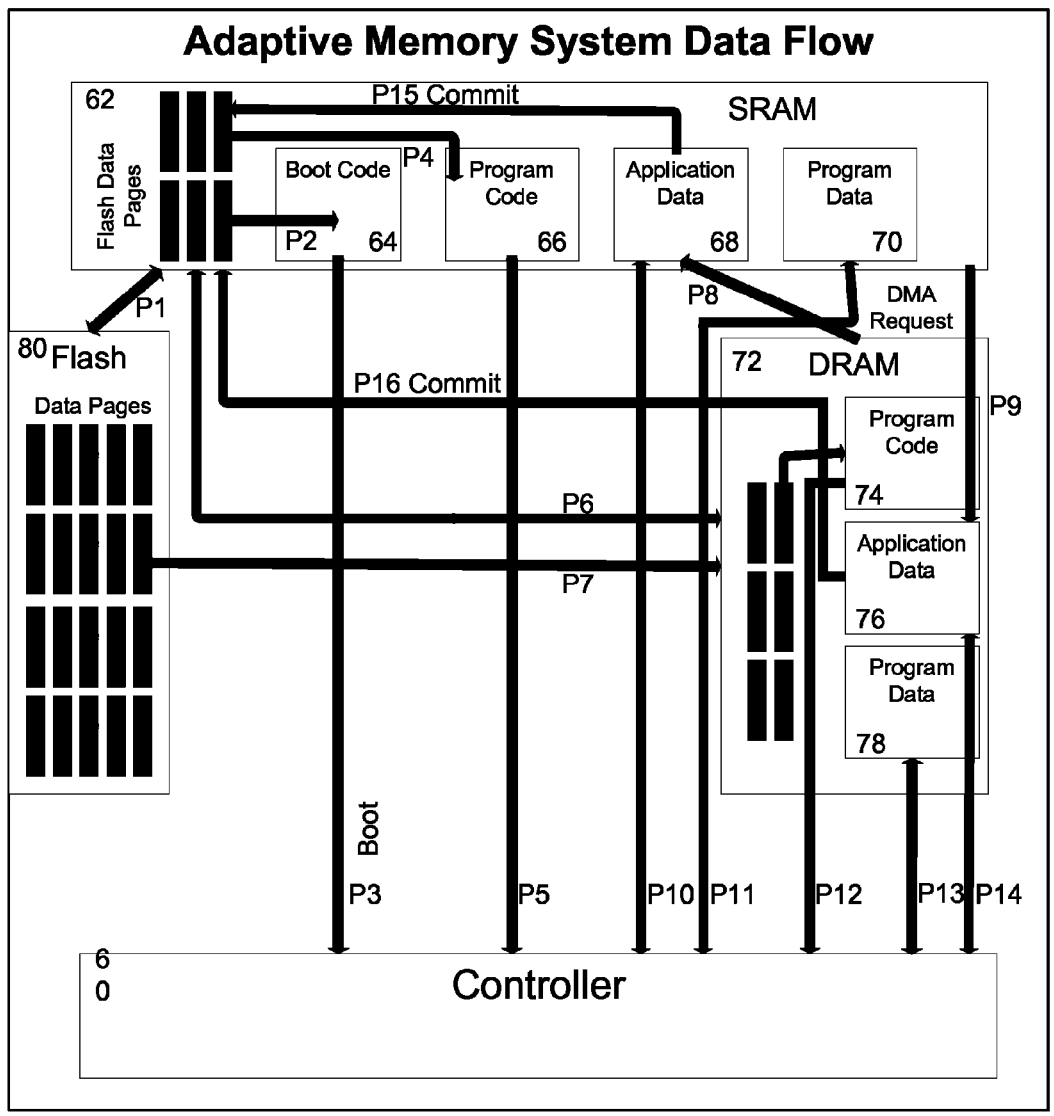
FIG. 4 is a block diagram illustrating the detailed data flow between the AMS memory components and the processor, facilitated by the AMS Controller, in accordance with one embodiment of the present invention.

FIG. 4 illustrates the data transfer between the AMS Memory Components and the AMS Controller 60 in accordance with one embodiment of the present invention. In this representation the discrete blocks of Flash data are referred to as "pages". These data pages are initially transferred from the Flash 80 to the SRAM 62, as indicated by path P1. The pages are then grouped together and cached via path P2 to create a block of boot code data 64, which is then transferred to the Controller 60 via path P3. As part of the initialization sequence or booting, the Controller 60 will configure the DRAM cache 72 to allow normal operation including DRAM access. The Controller 60 then operates using program code 66 transferred from the SRAM cache 62 via path P5, which was cached via path P4 from the SRAM data pages originally sent from the Flash 80 via path P1. When the limited capacity of the SRAM cache 62 is exceeded, additional pages of code required to be cached are transferred from the SRAM cache 62 to the DRAM cache 72 via path P6 or, if the SRAM cache 62 is determined to be full and the additional pages are not already present in the SRAM cache 62, they are transferred directly from the Flash 80 to the DRAM 72 via path P7. The Controller 60 can then execute program code 74 stored in the DRAM cache 72, accessed via path P12.

Program Data and Application Data

Program and application data fills the AMS memory space from within the Internal Bus System 20 (see FIG. 1). As illustrated in FIG. 4, the Controller 60 may access blocks of application data or program data 68, 70, 76 and 78 in either the SRAM or DRAM cache 62, 72, using paths P10, P11, P14, and P13. To commit application data into the Flash 80, a page or pages of information must first be assembled in either the SRAM or DRAM cache 62, 72. When the content has been confirmed, the Controller 60 indicates that the page or pages are to be "committed" to the Flash 80. This is indicated by path P15 "Commit" and by path P16 "Commit." The committed pages are then written to Flash 80 using path P1. The Controller 60 can also request transfer of application data between the SRAM and DRAM blocks 68, 76. Upon request, transfers are scheduled and executed as indicated by paths P8 and P9.

Controller Logic and Data Flow

Figure 5:
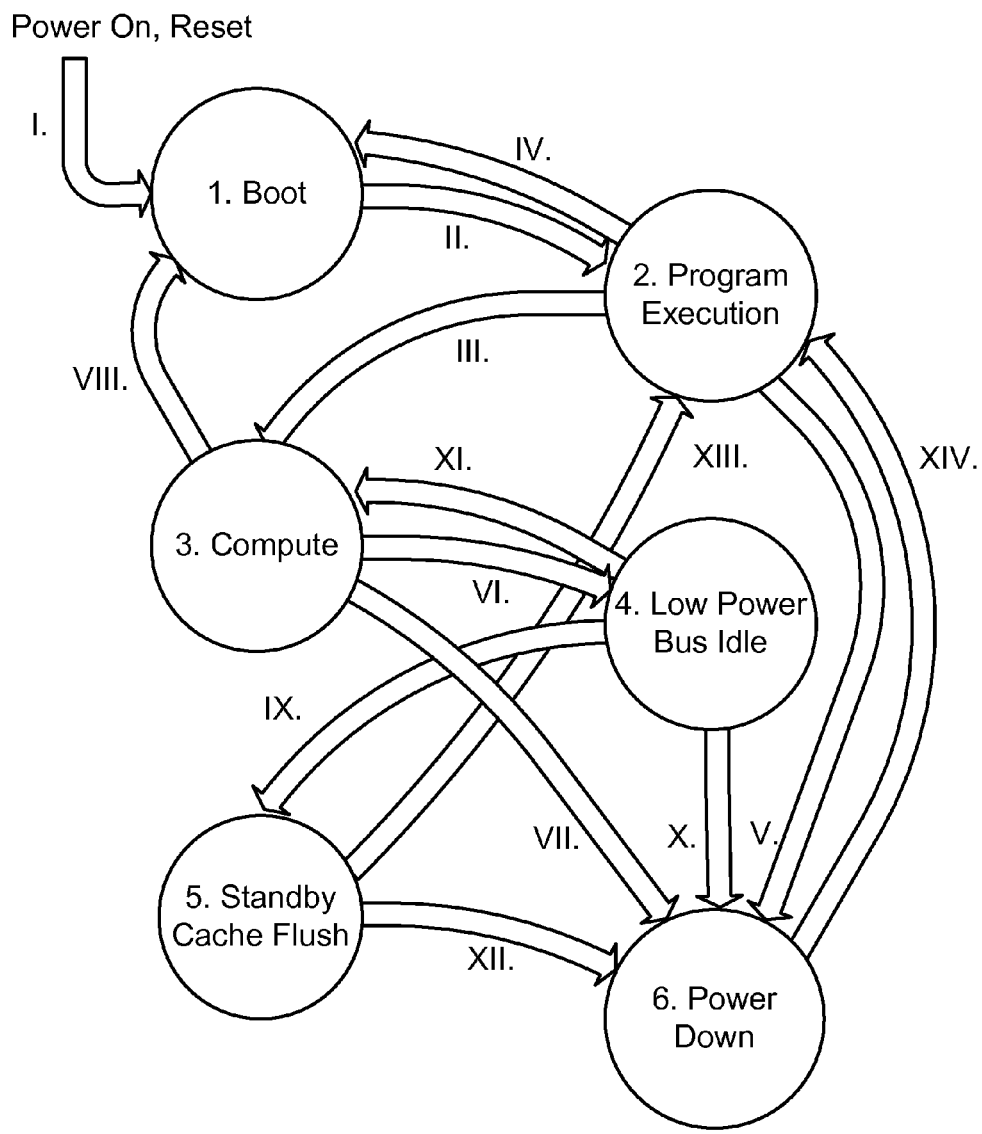
FIG. 5 is a state machine diagram for the AMS Controller illustrating the data-flow transitions at different operational processing stages, in accordance with one embodiment of the present invention.

The algorithmic function of the AMS Controller logic, according to various exemplary embodiments of the present invention, is configured to perform the following:

1. To dynamically allocate portions of the SRAM and DRAM devoted to caching page data, and to adjust such allocation based on heuristics, preconfigured settings, and historical memory access information, which are stored in Flash memory. Allocation requests include requests from the processor for reading and writing data to the AMS memory components and DMA transfer requests. Implementation of the memory allocation algorithm is shown in FIG. 5 and associated tables: TABLE 1 and TABLE 2, below.
2. To fill portions of the SRAM and DRAM cache with data mirrored from other memory blocks, using the data look-ahead scheme illustrated in FIGS. 6-8. This data allocation uses adjustable data bus widths and occurs at rates determined to minimize power consumption.
3. To power off portions of the volatile SRAM and DRAM cache which have not been written to and which are not determined to be in use. Initially, these memory components are marked as not being written to, and each portion of memory is only powered up as required for caching data.

FIG. 5 illustrates the AMS Controller Data-Flow Diagram in the form of a state machine. TABLE 1 lists the corresponding state definitions and TABLE 2 lists the corresponding state transitions associated with the Data-Flow Diagram.

TABLE 1

AMS Controller Data-Flow Diagram State Definitions

| NO. | NAME | DESCRIPTION | DMA OPERATION | DRAM POWER | SRAM POWER |
| --- | --- | --- | --- | --- | --- |
| 1 | Boot | Processor starting up. DRAM cache not configured. | Copy boot code from Flash to SRAM, processor boots from SRAM. | OFF | Component Required for boot is on, others OFF |
| 2 | Program | Processor running initial applications, no data written. | Copy Flash pages to SRAM, DRAM caches. Execute DMA requests. | ON | ON |
| 3 | Compute | Processor running applications with data manipulation. | Copy Flash pages to SRAM, DRAM caches. Transfer SRAM cache overflow to DRAM. Execute DMA requests. | ON | ON |
| 4 | Low Power, Bus Idle | Idle bus from processor side. | SRAM backup to DRAM and commit to flash. Execute DMA requests. | ON | ON |

TABLE 1-continued

AMS Controller Data-Flow Diagram State Definitions

| NO. | NAME | DESCRIPTION | DMA OPERATION | DRAM POWER | SRAM POWER |
|---|---|---|---|---|---|
| 5 | Standby | Idle bus from processor side. Waiting for activity or power down. | | ON | OFF |
| 6 | Power Down | Processor requests low power state. | | Low Power Standby | |

TABLE 2

AMS Controller Data-Flow Diagram State Transitions

| TRANSITION | FROM STATE | TO STATE | CRITERIA |
|---|---|---|---|
| I | Power Up | 1 Boot | System rest active |
| II | 1 Boot | 2 Program | Internal boot initialization sequence completed |
| III | 2 Program | 3 Compute | System reset not active; System power down not active; Number of write cycles exceed threshold value |
| IV | 2 Program | 1 Boot | System reset active |
| V | 2 Program | 6 Power Down | System power down active |
| VI | 3 Compute | 4 Low Power, Bus Idle | No bus access request for duration timeout 1 |
| VII | 3 Compute | 6 Power Down | System power down active |
| VIII | 3 Compute | 1 Boot | System reset active |
| IX | 4 Low Power | 5 Standby | System power down not active; No bus access request for duration timeout 2 |
| X | 4 Low Power | 6 Power Down | System power down active |
| XI | 4 Low Power | 3 Compute | System power down not active; System bus access request detected |
| XII | 5 Standby | 6 Power Down | System power down active |
| XIII | 5 Standby | 2 Program | System power down not active; System bus access request detected |
| XIV | 6 Power Down | 2 Program | System bus access request detected |

The AMS Controller data look-ahead caching scheme is designed to anticipate what specific data requests will be initiated by the processor of an external computing device. The specific code or data pertaining to anticipated data requests can be pre-loaded into a high-speed memory device (i.e., cached) to enable it to be rapidly retrieved at the time the processor makes a request for similar code or data.

Figure 6:
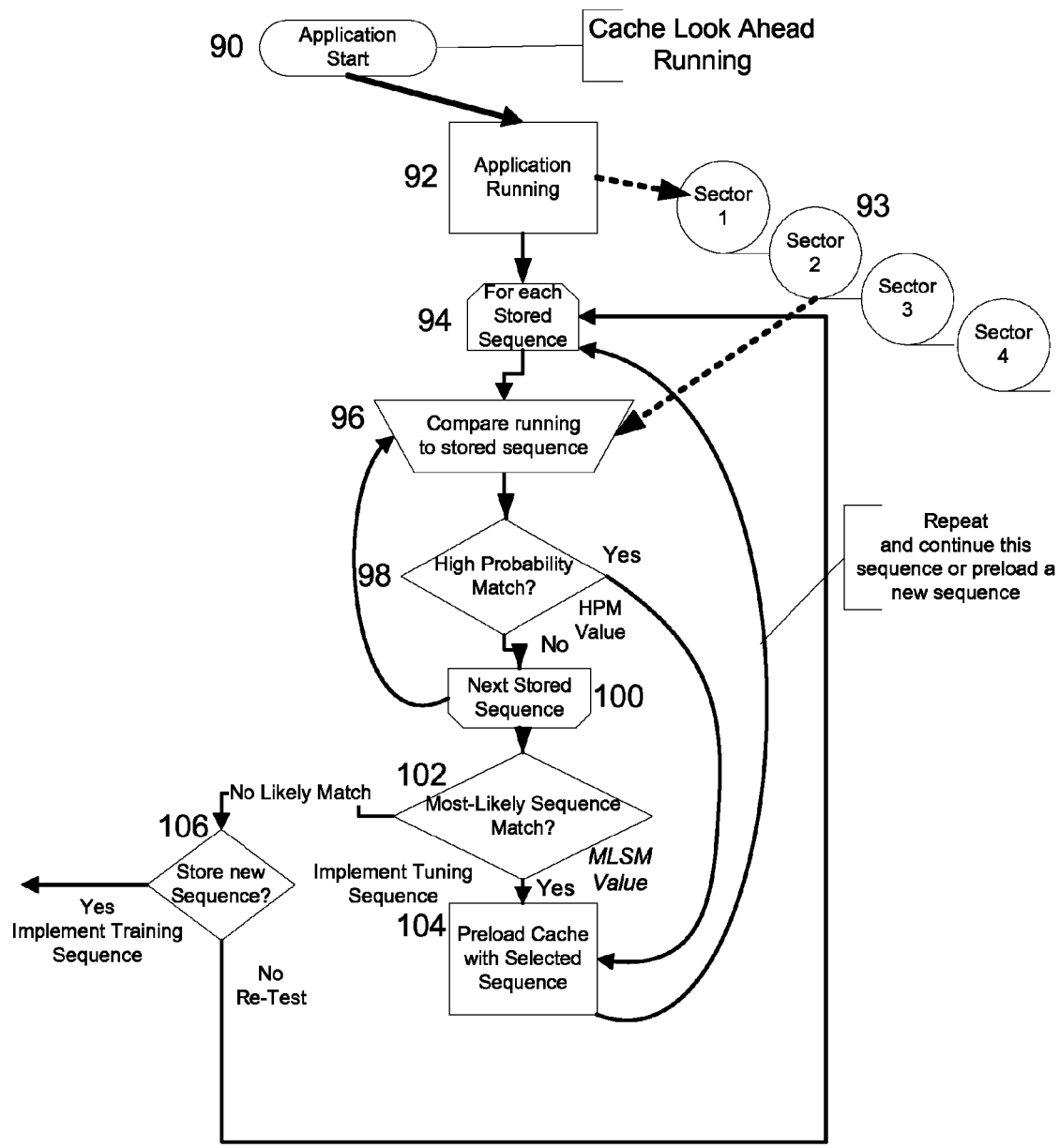
FIG. 6 is a flow diagram illustrating the AMS Controller cache data look-ahead scheme for filling portions of the AMS SRAM and DRAM cache, in accordance with one embodiment of the present invention.

FIG. 6 illustrates the running of this data look-ahead scheme for filling portions of the AMS SRAM and DRAM cache 14, 16 with sequences of sector data. A sector of data is the smallest block of data addressable by an operating system, which is typically around 512 bytes. A sequence of sector data 93 is an arbitrarily ordered set of sector data, characterized by its length. The look-ahead caching scheme of the present invention advantageously allows for portions of the Level 1 and Level 2 SRAM cache 14 as well as portions of the Level 3 DRAM cache 16 to be preloaded with predicted sequences of cache data, which are selectively determined through comparison of historical cache data with run-time application data, in blocks 96, 102, to be described below.

At the time an application is run on an external computing device, as in blocks 90, 92, sequences of acquired application sector data 93 are compared to each of the previously stored sequences of sector data, as in blocks 94, 96, to determine if a high-probability match can be found in block 98. Finding of a high-probability match will be described in detail below. If such a high-probability match is comparatively determined (Yes at 98) for each stored sequence, the previously stored sequence match is flagged as a high-probability match and preloaded into either the SRAM or DRAM cache in block 104, depending on whether the preferable SRAM cache has already been filled. The determination of such a high-probability match is based on a high-probability threshold value (or high-probability match (HPM) value), which is measured against the determined difference values between a particular sequence of acquired application sector data 93 and each previously stored sequence of sector data, as in blocks 94, 100. In one embodiment, the high-probability threshold value relates to a percentage value (i.e., 90-95%) of matching sequence sectors between the acquired application sequences and the previously stored sequences. In such an embodiment the determined difference values would also relate to percentage values in order to facilitate percentile comparison. If the determined difference value for any previously stored sequence of sector data is less than the high-probability threshold value, and also less than the determined difference value for any other previously stored sequence of sector data for the same sequence of acquired application sector data (Yes at 98), then that previously stored sequence of sector data is determined to be the high-probability match associated with the particular sequence of acquired application sector data 93.

However, if a high-probability match cannot be determined (No at 98), because none of the previously stored sequences of sector data have a determined difference value lower than the high-probability threshold value, then the lowest determined difference value is compared to a lower-precision most-likely sequence threshold value (or most-likely sequence match (MLSM) value), in block 102. In one embodiment, the most-likely sequence threshold value also relates to a percentage value of matching sequence sectors (i.e., 70-75%) between the acquired application sequences and the previously stored sequences. In such an embodiment the determined difference values would also relate to percentage values in order to facilitate percentile comparison. When the lowest determined difference value is measured to be higher than the high-probability threshold value, but lower then the most-likely sequence threshold value (No at 98 and Yes at 102), then that previously stored sequence of sector data is determined to be the most-likely sequence match associated with the particular sequence of acquired application sector data. In this case, when the most-likely sequence match is determined (Yes at 102), the associated previously stored sequence match is flagged as a most-likely sequence match and preloaded into either the SRAM or DRAM cache, in block 104, depending on whether the preferable SRAM cache 14 has already been filled.

With the lower-precision most-likely sequence match, the sequence may be further flagged for re-tuning, as will be described in detail in reference to FIG. 8 below. The need for re-tuning is particularly indicated by repeat cases where a sequence is identified as a most-likely sequence match, as these sequences are more likely in need of tuning adjustment (i.e., re-ordering of sector data).

If a most-likely sequence match cannot be determined (No at 102), because none of the previously stored sequences of sector data have a determined difference value lower than the most-likely sequence threshold value, the AMS Controller 12 determines if the particular acquired sequence of application sector data should be stored, based on a likelihood of error determination in block 106. If No at block 106, retest comparison is implemented. If Yes at block 106, the particular acquired sequence of application sector data should be preloaded into the cache by initiating a cache training sequence, as will be described in detail in reference to FIG. 7 below.

Figure 7:
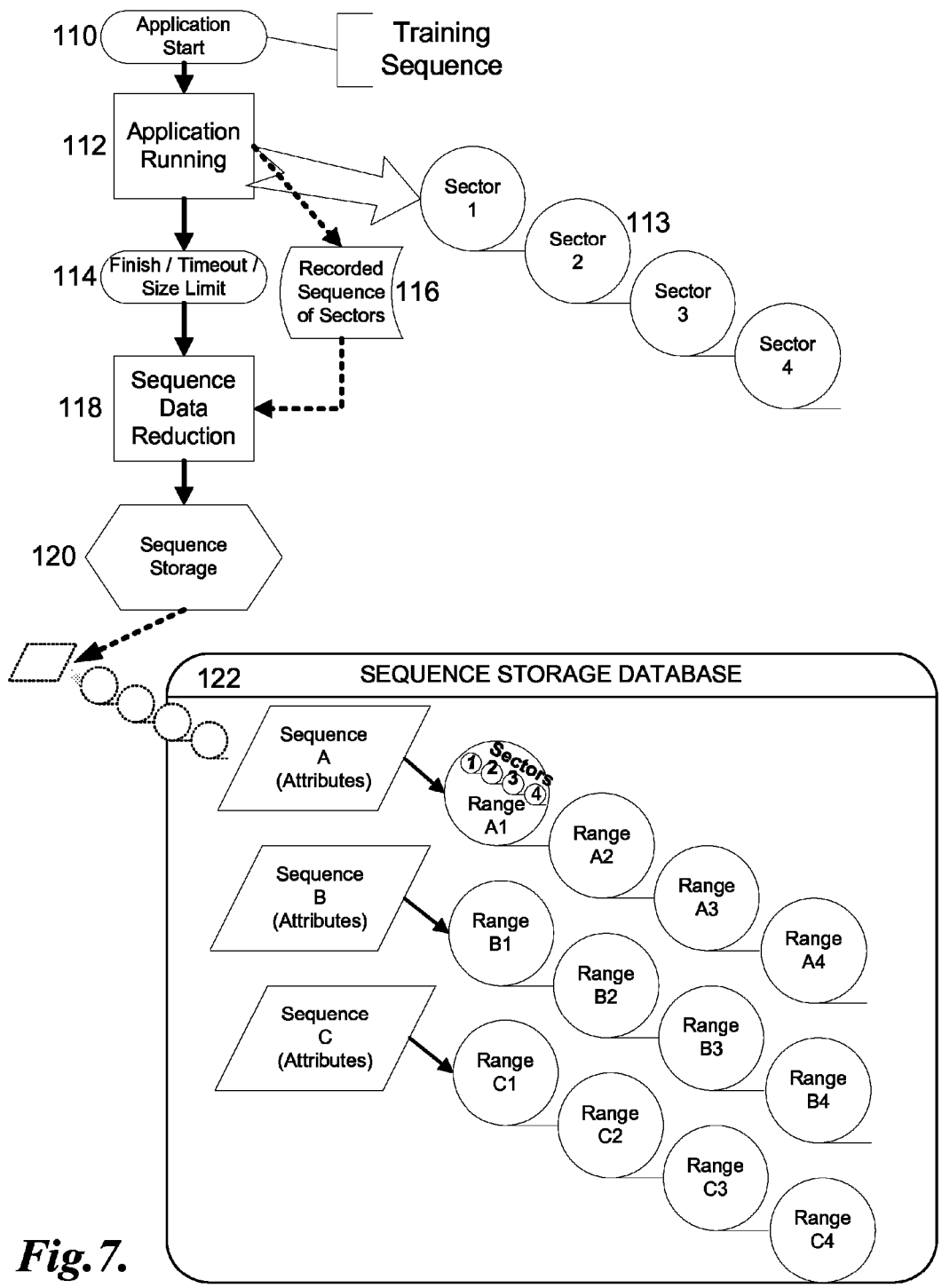
FIG. 7 is a flow diagram illustrating the training sequence associated with the AMS Controller cache data look-ahead scheme, in accordance with one embodiment of the present invention.

FIG. 7 illustrates the running of the AMS Controller cache data look-ahead training sequence for filling portions of the AMS SRAM and DRAM cache 14, 16, with particular sequences of sector data 113, acquired from an application run on an external computing device, as in blocks 110, 112. After the sequences of application sector data finish loading, time out, or exceed a predetermined size limit, as seen in block 114, the training sequence progresses to the sequence data reduction block 118, and then cache data storage in block 120 for the previously recorded sequences of sector data 116, 122. At the time of sequence data storage 120 to the either the volatile SRAM 14 or DRAM 16 cache, the AMS Controller further sends a copy of the sequence data, designated for cache assignment, to the non-volatile Flash as a backup data storage device. The data reduction in block 118 is implemented by replacing sequences of unordered sector data with sequences comprised of ordered ranges of sector data. This reduction creates a more efficient cache storage and retrieval mechanism.

Figure 8:
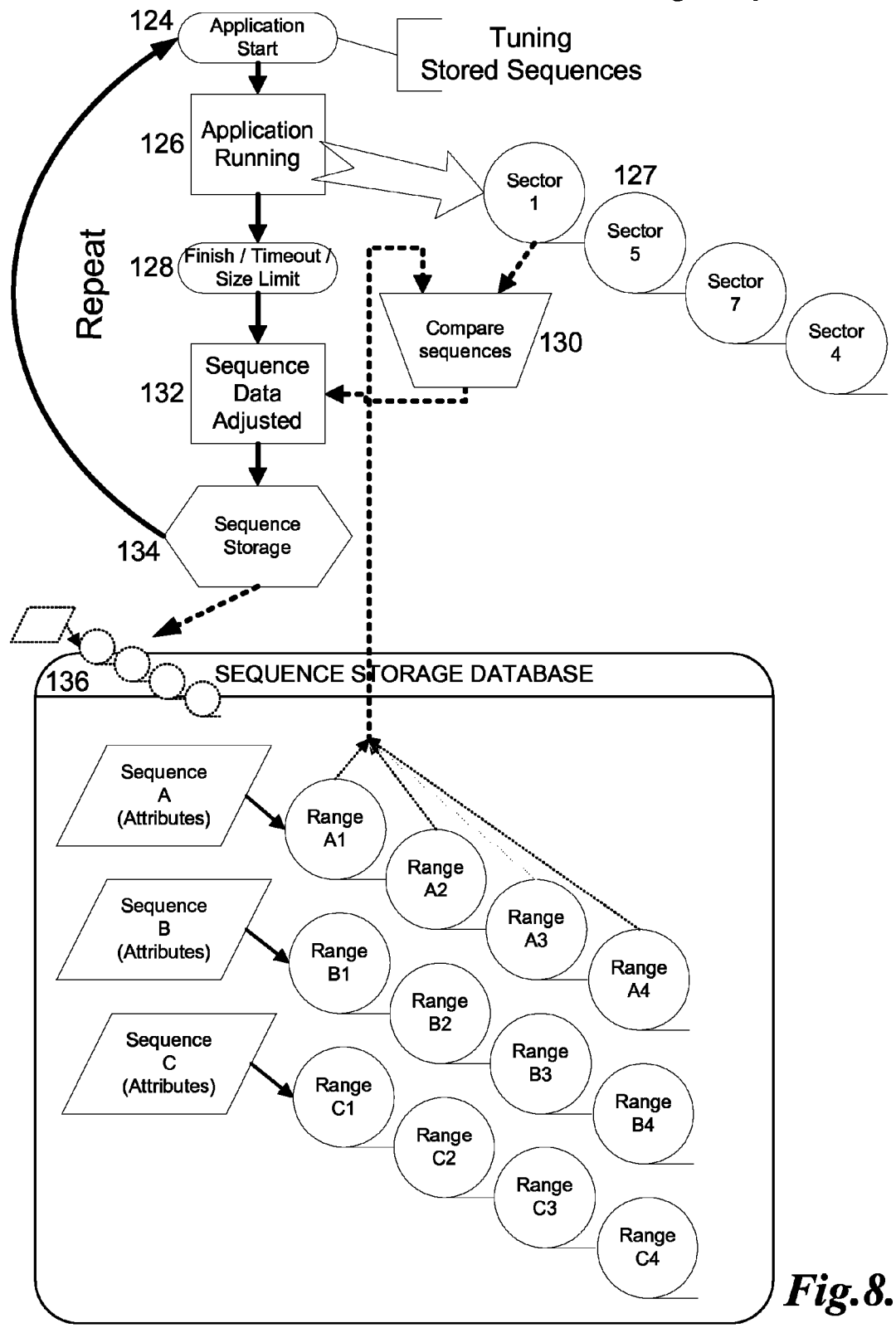
FIG. 8 is a flow diagram illustrating the tuning sequence associated with the AMS Controller cache data look-ahead scheme, in accordance with one embodiment of the present invention.

FIG. 8 illustrates the running of the AMS Controller cache data look-ahead tuning sequence for tuning portions of the AMS SRAM and DRAM cache 14, 16, such that existing sequences of stored sector data 136 are compared to acquired sequences of application sector data 127, as in blocks 124, 126, 128, and 130. The resulting unordered sequences of sector data are subsequently tuned into ordered sequences of sector data in block 132, and stored as ranges of ordered sequences 136 in block 134. If an initial run of the tuning sequence does not effectively refine the ordering of all sequences of sector data, the tuning sequence will be repeated.

Figure 9:
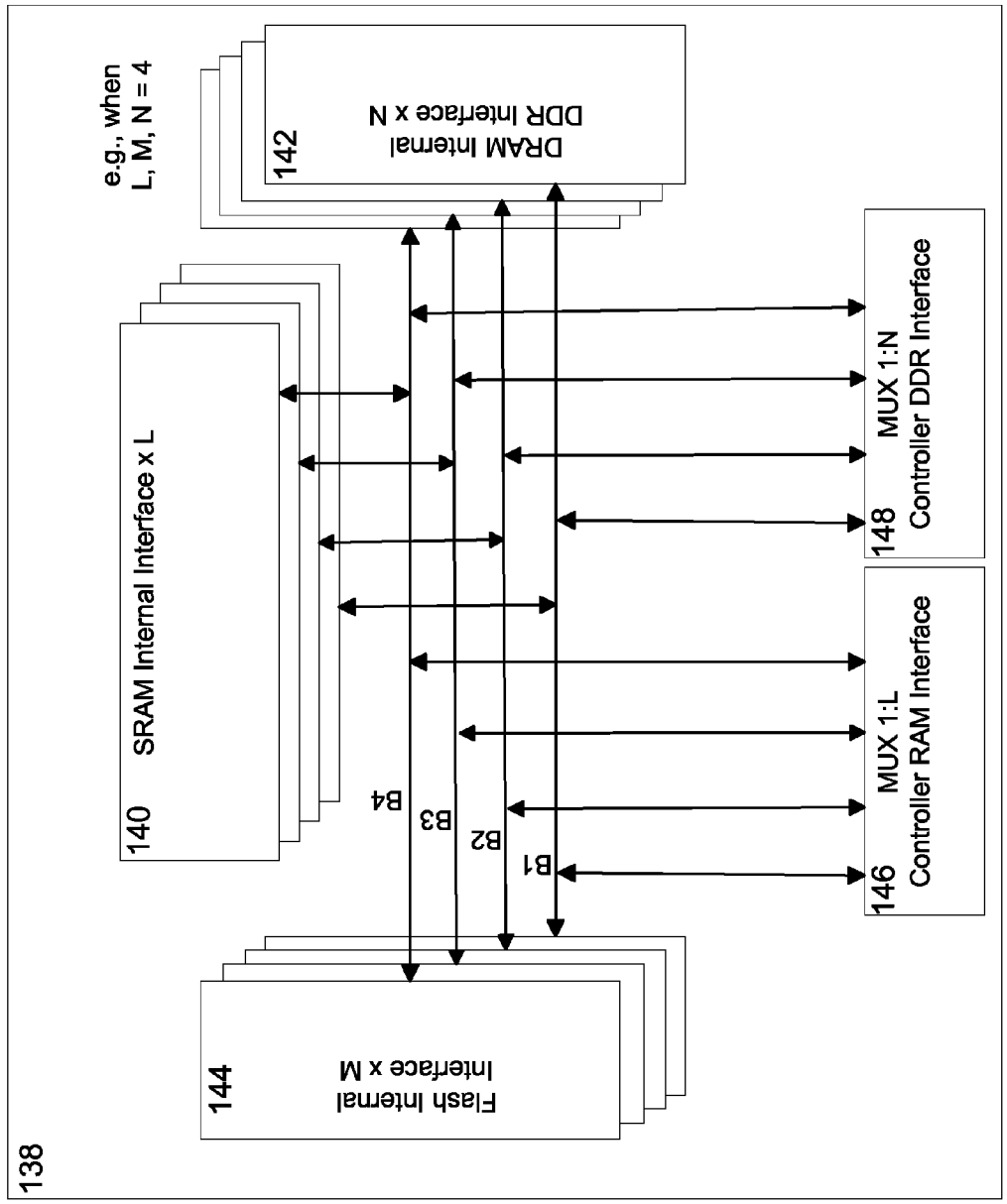
FIG. 9 is a block diagram illustrating the data flow and associated bandwidth allocation of the AMS Controller, in accordance with one embodiment of the present invention.

FIG. 9 illustrates the data flow and associated bandwidth allocation of the AMS Controller, in accordance with one embodiment of the present invention. In this embodiment, the AMS Controller 138 comprises SRAM Internal Memory Interface(s) 140, DRAM DDR Internal Memory Interface(s) 142, and Flash Internal Memory Interface(s) 144, as well as RAM External Processor Interface(s) 146 and DDR External Processor Interface(s) 148. These combined Controller Interfaces 140, 142, 144, 146, and 148 have a total bus bandwidth that is significantly larger than that of the external computing device's processor bus interface (not shown). This excess bus data transfer capacity allows the AMS Controller 138 to directly transfer cache data between memory devices (DMA) and at the same time allows the external computing device's processor to separately access data from the AMS memory components. This interleaved data transfer advantageously allows the AMS Controller 138 to operate at an increased total-data transfer rate.

The actual bus for each AMS memory component device type (SRAM 14, DRAM 16, and Flash 18) may be configured to either be of the same base or multipliers of the same base, depending on the specific size and capacity characteristics of each implemented memory component. FIG. 9 shows an example of a 4:1 difference between the internal bus width for the internal interface components 140, 142, and 144 and the external bus width for the external processor interface components 146, 148, when N=4, and the same bus configurations used for SRAM, when L=4, and the Flash, when M=4.

The AMS Controller's 138 excess bus capacity can be utilized when the external computing device's processor accesses DRAM memory through the two distinct internal data busses B1 and B2. This interleaved access allows cache data from consecutive DRAM addresses to be supplied alternately by two different internal DRAM data busses B1, B2. This parallel DRAM data transfer allows the DDR External Processor bus to be operated at a faster data transfer rate than is required on the internal bus. Simultaneous to this access, DMA data transfers can occur between the Flash 18 and a cache contained in SRAM or DRAM memory devices 14, 16, using data busses B3 and B4.

It should be understood that the actual bus bandwidth difference would be different from the theoretical 4:1 factor due to differences in latency settings and cycle times between actual internal and external bus implementations. The internal bus supports multiple bus transfer protocols, which likely do not reflect the same protocols used by the external processor bus. For example, both versions and settings used by a DDR External Processor protocol are likely substantially different from those used by an internal bus protocol.

One way to increase a data transfer rate (commonly measured in Megabytes per second) for writing data to or reading data from non-volatile memory (e.g., Flash), is to read or write the data to multiple memory components simultaneously. Utilizing this parallel data-transfer scheme, large blocks of data can be transferred as efficiently as possible, using the multiple distinct memory components.

It would be advantageous to be able to facilitate an operating system of a computing device having as small a read-write data unit size as possible. Utilizing a smaller minimum unit size (i.e., a data sector) avoids unnecessarily wasting memory storage space when smaller pieces of information are read from or written to memory (e.g., when file directory information is encoded with many small pieces of information). Further, utilizing a smaller unit of data also avoids unnecessary write operations which might wear out a given recording medium.

Unfortunately, the two goals of achieving faster data transfer rates and smaller sector size are often in conflict. A means of increasing the data transfer rate, while maintaining a smaller unit of data size is desired. In addition, it is desired to accomplish this with both minimal power loss and minimal required interconnects between MCP components.

As shown in FIG. 9, the AMS Controller 138 includes multiple non-volatile component interfaces 144 (e.g., Flash Interfaces). These multiple interfaces facilitate reading from and writing to multiple non-volatile components simultaneously, thereby increasing read and write data transfer rates to the multiple components of a single non-volatile device.

Unfortunately, this introduces an inherent disadvantage when smaller blocks of data are stored. To overcome this disadvantage, the individual non-volatile Flash interfaces 144 of the present invention include a feature enabling each of the individual flash components during a single read or write operation. Multiple techniques to accomplish this goal of enabling or disabling components can be realized. The first technique is to use individual enable signals to each non-volatile component. This technique has the advantage of minimizing the power loss by disabling unused devices during a given read or write operation. A second technique is to modify the addresses used during a given write operation.

As is well known in the art, non-volatile storage devices, such as Flash, have certain address locations that are known to be defective, and thus cannot be used for storing information. With the second technique, the address locations of the individual components which are not desired to be written to are set to a location that is known to be defective. The excess write operation does not disrupt valid stored information because this address location is already flagged to be defective, and information will never be retrieved from this location. This further does not require additional connections to the component, because the address information is already required to be presented to the component for normal operations. The goal of writing to a subset of the components is thus accomplished without additional cost of connections between the Controller and the non-volatile storage components.

Additional Interfaces for the AMS

As illustrated in FIG. 1, in one embodiment of the present invention, the AMS MCP integrated circuit is designed to include an Expansion Flash Bus 26 and an Expansion DRAM Bus 24, to be coupled with additional DRAM and Flash memory components. As would be understood by one skilled in the art, additional DRAM and Flash memory components should be configured to function with the existing driver software present in the Embedded SRAM/DRAM/Flash Installable File System 54 within the existing AMS File System Partitions 50 (see FIG. 3). Otherwise, the added DRAM or Flash memory components would require the existing AMS memory component drivers to be updated, so that unpredictable errors could be avoided at installation.

Further, in one embodiment of the present invention, the AMS MCP integrated circuit is designed to include an Expansion Bus Interface 28 (illustrated in FIG. 1), whereby the Controller is capable of communicating with a secondary computing device through an expansion bus. This Expansion Bus Interface 28 is shown as being independent from the Expansion DRAM Bus 24 and the Expansion Flash Bus 26, only for convenience and clarity, however, it should be recognized that the Expansion Bus Interface 28 could configurably be incorporated into either the Expansion DRAM Bus 24 or the Expansion Flash Bus 26, to reduce the AMS Controller pin-count. The Expansion Bus Interface 28 effectively allows the AMS Controller to communicate and transfer stored data to multiple external computing devices simultaneously.

As previously stated, it should be also be understood that the SRAM 14, DRAM 16 and Flash 18 memory components of the present embodiment (illustrated in FIG. 1) are mere examples of memory types capable of functioning within the AMS, and that the invention is not limited to the precise memory types used in this embodiment. Alternate technologies exist which offer similar characteristics and functionality as the above memory types offer. For example, the implementation of the SRAM 14 could be replaced with a type of Pseudo SRAM (PSRAM); the implementation of the DRAM 16 could be replaced with a type of Zero Capacitor RAM (ZRAM) or with Twin Transistor RAM (TTRAM); and the implementation of the Flash 18 could be specifically designated as NAND or NOR type Flash or could be replaced with a type of Phase Change Memory (PCM, PRAM). Clearly the above listing of alternate memory component types is not exhaustive, and many other variations could be implemented, while still allowing the present invention to function as described above.

The embodiments of the invention in which an exclusive property or privilege is claimed are defined as follows:

1. A non-transitory computer-readable medium having computer-executable instructions stored thereon that, if executed by a single controller of an adaptive memory system, causes the single controller to perform actions for implementing a data look-ahead caching scheme; wherein the adaptive memory system includes a first memory type, a second memory type, a third memory type, an internal bus system, and an external bus interface; and wherein the actions comprise: acquiring a sequence of sector data from an application run on an external computing device, wherein the sequence of sector data indicates a sequence of sectors from which data is requested, and wherein the sequence of sectors from which data is requested is arbitrarily ordered; comparing the acquired sequence of sector data to a plurality of previously stored sequences of sector data to determine if there is a high-probability match; caching at least the first memory type with a determined high-probability match if a high-probability match is determined between the acquired sequence of sector data and the plurality of previously stored sequences of sector data; and determining whether a most-likely sequence of sector data can be selected from the plurality of previously stored sequences of sector data if a high-probability match is not determined between the acquired sequence of sector data and the plurality of previously stored sequences of sector data.

2. The non-transitory computer-readable medium of claim 1, wherein the first memory type is Static Random Access Memory (SRAM), the second memory type is Dynamic Random Access Memory (DRAM), and the third memory type is Flash Memory.

3. The non-transitory computer-readable medium of claim 1, wherein the actions further comprise: caching a selected most-likely sequence of sector data into either the first memory type or the second memory type if a most-likely sequence of sector data can be selected; and initiating a cache-data training sequence if a most-likely sequence of sector data cannot be selected.

4. The non-transitory computer-readable medium of claim 3, wherein the cache-data training sequence stores the acquired sequence of sector data within either the first memory type or the second memory type with a non-volatile copy of the sequence stored in the third memory type.

5. The non-transitory computer-readable medium of claim 4, wherein the first memory type is Static Random Access Memory (SRAM), the second memory type is Dynamic Random Access Memory (DRAM), and the third memory type is Flash Memory.

6. A method for implementing a data look-ahead caching scheme of a single controller of an adaptive memory system, wherein the adaptive memory system includes a single controller, a first memory type, a second memory type, a third memory type, an internal bus system, and an external bus interface, the method comprising:
    acquiring a sequence of sector data from an application run on an external computing device, wherein the sequence of sector data indicates a sequence of sectors from which data is requested, and wherein the sequence of sectors from which data is requested is arbitrarily ordered;

comparing the acquired sequence of sector data to a plurality of previously stored sequences of sector data to determine if there is a high-probability match;

caching the determined high-probability match data to at least the first memory type if a high-probability match is determined between the acquired sequence of sector data and the plurality of previously stored sequences of sector data; and determining whether a most-likely sequence of sector data can be selected from the plurality of previously stored sequences of sector data if a high-probability match is not determined between the acquired sequence of sector data and the plurality of previously stored sequences of sector data.

7. The method of claim 6, wherein the first memory type is Static Random Access Memory (SRAM), the second memory type is Dynamic Random Access Memory (DRAM), and the third memory type is Flash Memory.

8. The method of claim 6, further comprising:

caching a selected most-likely sequence of sector data into either of the first memory type or the second memory type if a most-likely sequence of sector data can be selected; and initiating a cache-data training sequence if a most-likely sequence of sector data cannot be selected.

9. The method of claim 8, wherein the cache-data training sequence stores the acquired sequence of sector data within either the first memory type or the second memory type with a non-volatile copy of the sequence stored in the third memory type.

10. The method of claim 9, wherein the first memory type is Static Random Access Memory (SRAM), the second memory type is Dynamic Random Access Memory (DRAM), and the third memory type is Flash Memory.

* * * * *